US012749521B2

(12) United States Patent
Lu et al.

(10) Patent No.: US 12,749,521 B2
(45) Date of Patent: Sep. 29, 2026

(54) PERFORMING SERIALIZED UPDATE PROCEDURES DURING A REFRESH PERIOD

(71) Applicant: Micron Technology, Inc., Boise, ID (US)

(72) Inventors: Yang Lu, Boise, ID (US); Donald Morgan, Meridian, ID (US); QiaoHua Dong, Atlanta, GA (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 19/015,993

(22) Filed: Jan. 10, 2025

(65) Prior Publication Data

US 2026/0204307 A1 Jul. 16, 2026

(51) Int. Cl.
*G11C 11/406* (2006.01)

(52) U.S. Cl.
CPC .. *G11C 11/40603* (2013.01); *G11C 11/40615* (2013.01)

(58) Field of Classification Search
CPC .................... G11C 11/40603; G11C 11/40615
See application file for complete search history.

(56) References Cited

U.S. PATENT DOCUMENTS 9,466,351 B2 * 10/2016 Jeong ................ G11C 11/40611
2013/0304982 A1 * 11/2013 Jung ..................... G11C 11/403 711/106
2019/0228813 A1 * 7/2019 Nale .................. G11C 11/4096
2025/0292821 A1 9/2025 Lu

* cited by examiner

*Primary Examiner* — Jay W. Radke
(74) *Attorney, Agent, or Firm* — Colby Nipper PLLC

(57) ABSTRACT

Apparatuses and techniques for performing serialized update procedures during a refresh period are described. In example aspects, a memory device performs a normal refresh operation, which refreshes multiple rows simultaneously. The refreshed rows are associated with different refresh sections and different column segments. While refreshing the rows and prior to an end of a refresh cycle time (tRFC), the memory device updates, in a serialized manner, usage-based-disturbance data that is stored within the refreshed rows. In particular, the memory device performs, in series, multiple update procedures, which overwrites values of the usage-based-disturbance data that are stored within the refreshed rows. For example, the multiple update procedures can set values of activation counts that are stored within the refreshed rows to a predetermined value. By performing the multiple update procedures in series, the memory device can utilize appropriate column repair solutions to access the usage-based-disturbance data and avoid a potential conflict on global input/output (GIO) lines.

20 Claims, 8 Drawing Sheets

PERFORMING SERIALIZED UPDATE PROCEDURES DURING A REFRESH PERIOD

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and non-volatile memory (e.g., flash memory). Like the capabilities of a processor, the capabilities of a memory can impact the performance of an electronic device. This performance impact can increase as processors are developed that execute code faster and as applications operate on increasingly larger data sets that require ever-larger memories.

BRIEF DESCRIPTION OF THE DRAWINGS

Apparatuses of and techniques for performing serialized update procedures during a refresh are described with reference to the following drawings. The same numbers are used throughout the drawings to reference like features and components.

DETAILED DESCRIPTION

Overview

Figure 1:
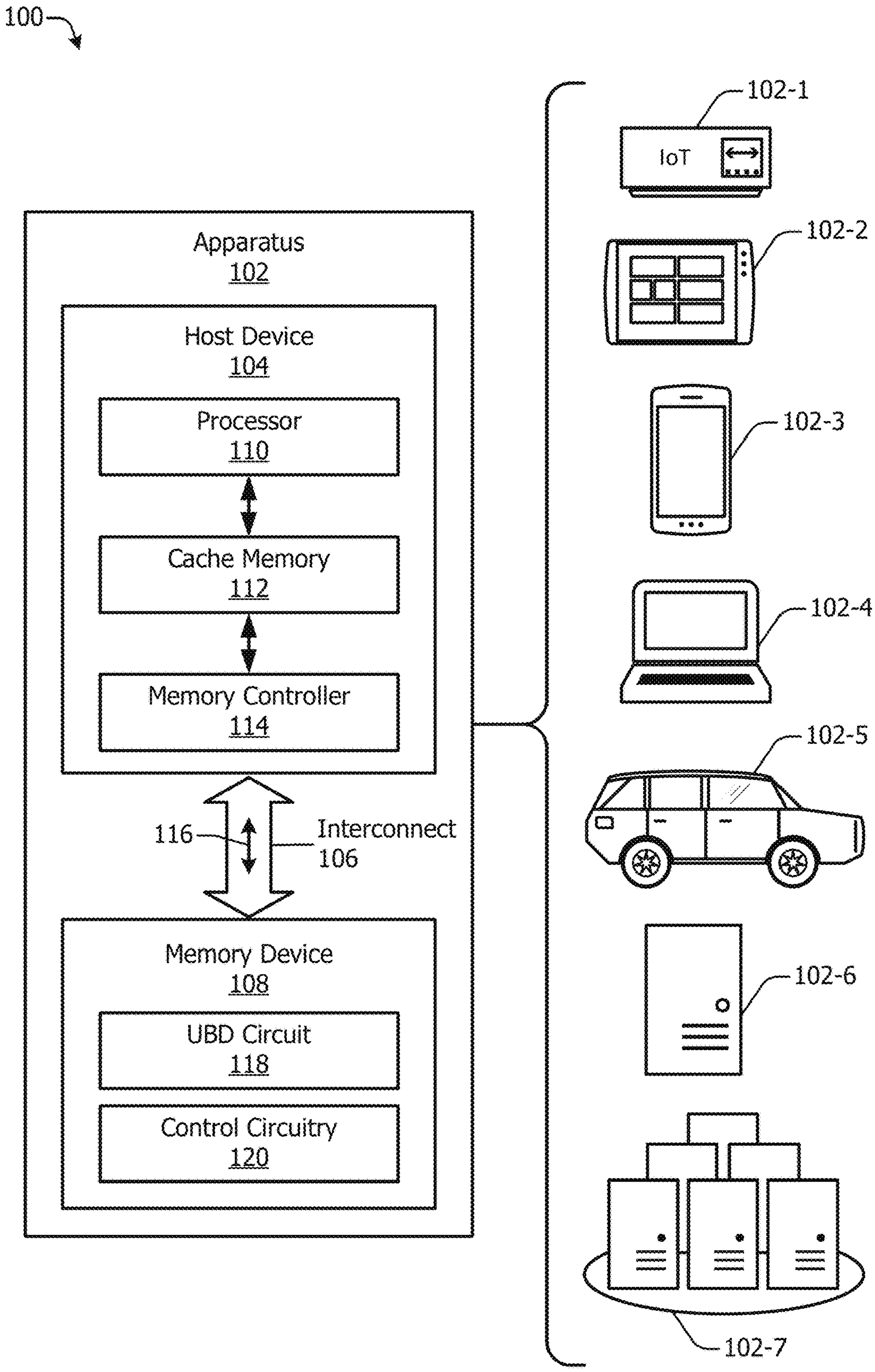
FIG. 1 illustrates example apparatuses that can implement aspects of serialized update procedures during refresh.

Processors and memory work in tandem to provide features to users of computers and other electronic devices. As processors and memory operate more quickly together in a complementary manner, an electronic device can provide enhanced features, such as high-resolution graphics and artificial intelligence (AI) analysis. Some applications, such as those for financial services, medical devices, and advanced driver assistance systems (ADAS), can also demand more-reliable memories. These applications use increasingly reliable memories to limit errors in financial transactions, medical decisions, and object identification. However, in some implementations, more-reliable memories can sacrifice bit densities, power efficiency, and simplicity.

To meet the demands for physically smaller memories, memory devices can be designed with higher chip densities for the memory cells. Increasing chip density, however, can increase the electromagnetic coupling between proximate rows of memory cells due, at least in part, to a shrinking distance between these rows. With this undesired electromagnetic coupling (e.g., capacitive coupling), activation (or charging) of a first row of memory cells can sometimes negatively impact the integrity of the digital values stored in a second nearby row of memory cells. This phenomenon is referred to as usage-based disturbance herein. Activation of the first row can generate interference, or crosstalk, that causes the second row to experience a voltage fluctuation. In some instances, this voltage fluctuation can cause a state, or value, of a memory cell in the second row to be incorrectly determined by a sense amplifier. Consider an example in which a state of a memory cell in the second row is a logical "1" (e.g., a high voltage). In this example, the voltage fluctuation can cause a sense amplifier to incorrectly determine the state of the memory cell to be a logical "0" (e.g., a low voltage) instead of a logical "1." Left unchecked, this interference can lead to memory errors or data loss within the memory device.

In some circumstances, a particular row of memory cells is activated repeatedly in an unintentional or intentional manner, which can be part of a malicious act. Such a row that is repeatedly activated is referred to herein as an aggressor row. Consider, for instance, that memory cells in an $R^{th}$ row are subjected to repeated activation, which causes one or more memory cells in a proximate row (e.g., an adjacent row) to change states. Here, a proximate row can include another row within an R+1 row, which is an adjacent row; an R+2 row; an R−1 row, which is another adjacent row; and/or an R−2 row. These proximate rows are referred to herein as victim rows. The effect of changed memory states is referred to as a usage-based disturbance. The occurrence of usage-based disturbance can lead to the corruption or changing of contents within the affected row of memory. As described herein below, to combat the negative effects of usage-based disturbance, a memory device can perform usage-based-disturbance mitigation operations.

Some memory devices utilize circuits that can detect usage-based disturbance and mitigate its effects. To monitor for usage-based disturbance, a memory device can store an activation count for each row of a memory array. The activation count keeps track of a quantity of accesses or activations of the corresponding memory row. If the activation count meets (e.g., equals or exceeds) a threshold, nearby rows may be at increased risk for data corruption due to the repeated activations of the accessed row and the usage-based disturbance effect. To manage this risk to the affected rows, the memory device can refresh the proximate rows.

To support these usage-based disturbance mitigation techniques, the activation counts of multiple rows that are refreshed need to be updated. It can be challenging to perform this update, however, as the memory device refreshes multiple rows in different refresh segments simultaneously. These different refresh sections can be associated with different column repair solutions, which means that different column select lines may need to be activated to access the activation counts of these different refreshed rows.

Some techniques may update the count at a later time after the rows are refreshed. To keep track of which refreshed rows need to be updated, a flag can be set within each refreshed row. Problems can occur, however, if there is a significant delay between the refreshing of the rows and the updating of the activation counts of the refreshed rows. Also, the utilization of a flag increases die size, which makes it more expensive to implement this technique. Generally, these techniques do not adequately address the conflict arising from refreshing rows having repaired columns without increasing die size and thus cost.

To address this and other issues regarding usage-based disturbance, this document describes aspects of performing serialized update procedures to usage-based-disturbance data during a refresh period. In example aspects, a memory device performs a normal refresh operation, which refreshes multiple rows simultaneously. The refreshed rows are associated with different refresh sections and different column segments. During the refreshing of the rows and prior to an end of a refresh cycle time (tRFC), the memory device updates, in a serialized manner, usage-based-disturbance data that is stored within the refreshed rows. In particular, the memory device performs, in series, multiple update procedures, which overwrites values of the usage-based-disturbance data that are stored within the refreshed rows. For example, the multiple update procedures can set values of activation counts that are stored within the refreshed rows to a predetermined value. By performing the multiple update procedures in series, the memory device can utilize appropriate column repair solutions to access the usage-based-disturbance data and avoid a potential conflict on global input/output (GIO) lines.

EXAMPLE OPERATING ENVIRONMENTS

FIG. 1 illustrates, at 100 generally, an example operating environment including an apparatus 102 that can perform serialized update procedures during a refresh period. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7 that may be part of cloud computing infrastructure, a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and a memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., a flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit, graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a double-data-rate (DDR) memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus (e.g., a unidirectional or bidirectional bus), switching fabric, or one or more wires that carry voltage or current signals. The interconnect 106 can propagate one or more communications 116 between the host device 104 and the memory device 108. For example, the host device 104 may transmit a memory request to the memory device 108 over the interconnect 106. Also, the memory device 108 may transmit a corresponding memory response to the host device 104 over the interconnect 106.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity relative to memory at higher hierarchical levels.

The apparatus 102 can be implemented in various manners with more, fewer, or different components. For example, the host device 104 may include multiple cache memories (e.g., including multiple levels of cache memory)

or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

Computer engineers may implement the host device 104 and the various memories in multiple manners. In some cases, the host device 104 and the memory device 108 can be disposed on, or physically supported by, a printed circuit board (e.g., a rigid or flexible motherboard). The host device 104 and the memory device 108 may additionally be integrated together on an integrated circuit or fabricated on separate integrated circuits and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114. This document describes with reference to FIG. 1 an example computing system architecture having at least one host device 104 coupled to a memory device 108.

Two or more memory components (e.g., modules, dies, banks, or bank groups) can share the electrical paths or couplings of the interconnect 106. The interconnect 106 can include at least one command-and-address bus (CA bus) and at least one data bus (DQ bus). The command-and-address bus can transmit addresses and commands from the memory controller 114 of the host device 104 to the memory device 108, which may exclude propagation of data. The data bus can propagate data between the memory controller 114 and the memory device 108. The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM).

The memory device 108 can form at least part of the main memory of the apparatus 102. The memory device 108 may, however, form at least part of a cache memory, a storage memory, or a system-on-chip of the apparatus 102. The memory device 108 includes at least one usage-based-disturbance circuit 118 (UBD circuit 118). The usage-based-disturbance circuit 118 mitigates usage-based disturbance for one or more banks associated with the memory device 108. This includes detecting a condition associated with usage-based disturbance and initiating a refresh of one or more victim rows associated with the detected condition. The usage-based-disturbance circuit 118 can perform an update procedure to update usage-based disturbance data that is associated with a row, as further described with respect to FIGS. 2 and 3.

The memory device 108 also includes control circuitry 120. The usage-based-disturbance circuit 118 and the control circuitry 120 can each be implemented using software, firmware, hardware, fixed logic circuitry, or some combinations thereof. The control circuitry 120 manages refresh operations and can cause the usage-based-disturbance circuit 118 to perform an update procedure during a refresh operation, as further described with respect to FIG. 7. The usage-based-disturbance circuit 118 and the control circuitry 120 operate together to perform aspects of serialized update procedures during a refresh period.

In example implementations, the usage-based-disturbance circuit 118 is implemented at a local-bank level (or a local level). This means that each instance of the usage-based-disturbance circuit 118 is associated with a particular bank or a particular set of banks. In contrast, the control circuitry 120 is implemented at a global-bank level (e.g., a global level or a central level). This means that one instance of the control circuitry 120 implemented at the global-bank level can interface with two or more usage-based-disturbance circuits 118 that are implemented at the local-bank level. Other components of the memory device 108 are further described with respect to FIG. 2.

Figure 2:
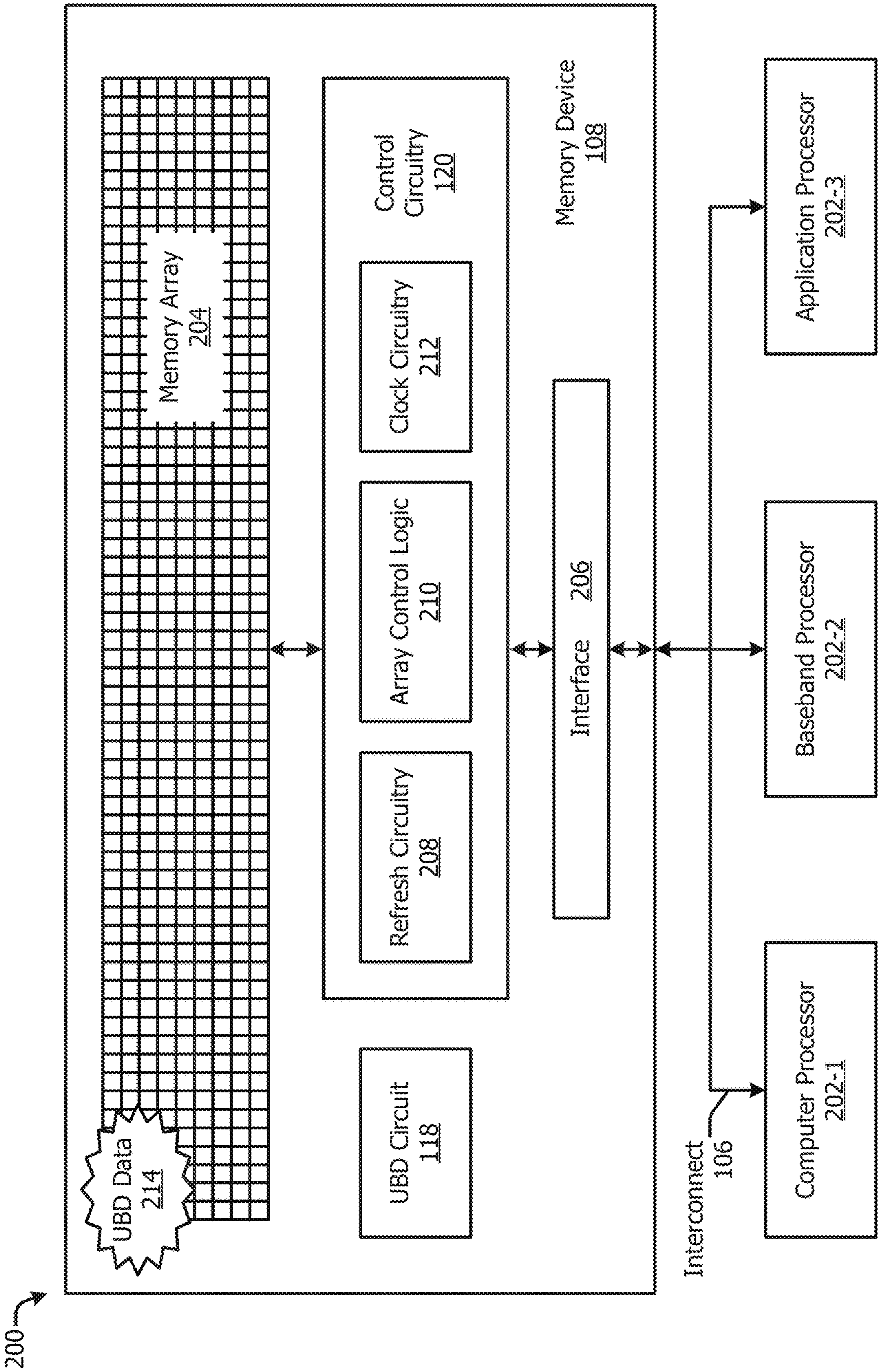
FIG. 2 illustrates an example computing system that can implement aspects of serialized update procedures during a refresh period within a memory device.

FIG. 2 illustrates an example computing system 200 that can perform serialized update procedures during a refresh period. In some implementations, the computing system 200 includes at least one memory device 108, at least one interconnect 106, and at least one processor 202. The memory device 108 can include, or be associated with, at least one memory array 204, at least one interface 206, at least one usage-based-disturbance circuit 118, and the control circuitry 120 (or periphery circuitry). The usage-based-disturbance circuit 118 and the control circuitry 120 are operatively coupled to the memory array 204.

The memory array 204 can include an array of memory cells, including but not limited to memory cells of DRAM, SDRAM, three-dimensional (3D) stacked DRAM, DDR memory, LPDDR SDRAM, and so forth. The memory array 204 and the control circuitry 120 may be components on a single semiconductor die or on separate semiconductor dies. The memory array 204 or the control circuitry 120 may also be distributed across multiple dies. This control circuitry 120 may manage traffic on a bus that is separate from the interconnect 106.

The control circuitry 120 can include various components that the memory device 108 can use to perform various operations. These operations can include communicating with other devices, managing memory performance, performing refresh operations (e.g., self-refresh operations or auto-refresh operations), and performing memory read or write operations. In the depicted configuration, the control circuitry 120 includes refresh circuitry 208, at least one array control circuit 210, and at least one instance of clock circuitry 212.

The refresh circuitry 208 includes circuitry for performing normal refresh operations, such as a self-refresh operation or an auto-refresh operation. The array control circuit 210 includes circuitry that provides command decoding, address decoding, input/output functions, amplification circuitry, power supply management, power control modes, and other functions. The clock circuitry 212 synchronizes various memory components with one or more external clock signals provided over the interconnect 106, including a command-and-address clock or a data clock. The clock circuitry 212 can also use an internal clock signal to synchronize memory components and may provide timer functionality.

The usage-based-disturbance circuit 118 can be coupled to a set of memory cells within the memory array 204 that store usage-based-disturbance data 214 (UBD data 214). The usage-based-disturbance data 214 can include information such as an activation count, which represents a quantity of times one or more rows within the memory array 204 have been activated (or accessed) by the memory device 108 since a last refresh. In example implementations, each row of the memory array 204 includes a subset of memory cells that stores the usage-based-disturbance data 214 associated with that row, as further described with respect to FIG. 3.

The interface 206 can couple the control circuitry 120 or the memory array 204 directly or indirectly to the interconnect 106. In some implementations, the refresh circuitry 208, the array control circuit 210, and the clock circuitry 212 can be part of a single component (e.g., the control circuitry 120). In other implementations, one or more of the refresh circuitry 208, the array control circuit 210, or the clock circuitry 212 may be implemented as separate components, which can be provided on a single semiconductor die or disposed across multiple semiconductor dies. These components may individually or jointly couple to the interconnect 106 via the interface 206.

The interconnect 106 may use one or more of a variety of interconnects that communicatively couple together various components and enable commands, addresses, or other information and data to be transferred between two or more components (e.g., between the memory device 108 and the processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address bus and a data bus.

In some aspects, the memory device 108 may be a "separate" component relative to the host device 104 (of FIG. 1) or any of the processors 202. The separate components can include a printed circuit board, memory card, memory stick, and memory module (e.g., a single in-line memory module (SIMM) or dual in-line memory module (DIMM)). Thus, separate physical components may be located together within the same housing of an electronic device or may be distributed over a server rack, a data center, and so forth. Alternatively, the memory device 108 may be integrated with other physical components, including the host device 104 or the processor 202, by being combined on a printed circuit board or in a single package or a system-on-chip.

As shown in FIG. 2, the processors 202 may include a computer processor 202-1, a baseband processor 202-2, and an application processor 202-3, coupled to the memory device 108 through the interconnect 106. The processors 202 may include or form a part of a central processing unit, graphics processing unit, system-on-chip, application-specific integrated circuit, or field-programmable gate array. In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, Wi-Fi™, Bluetooth™, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices). The memory array 204 is further described with respect to FIG. 3.

Figure 3:
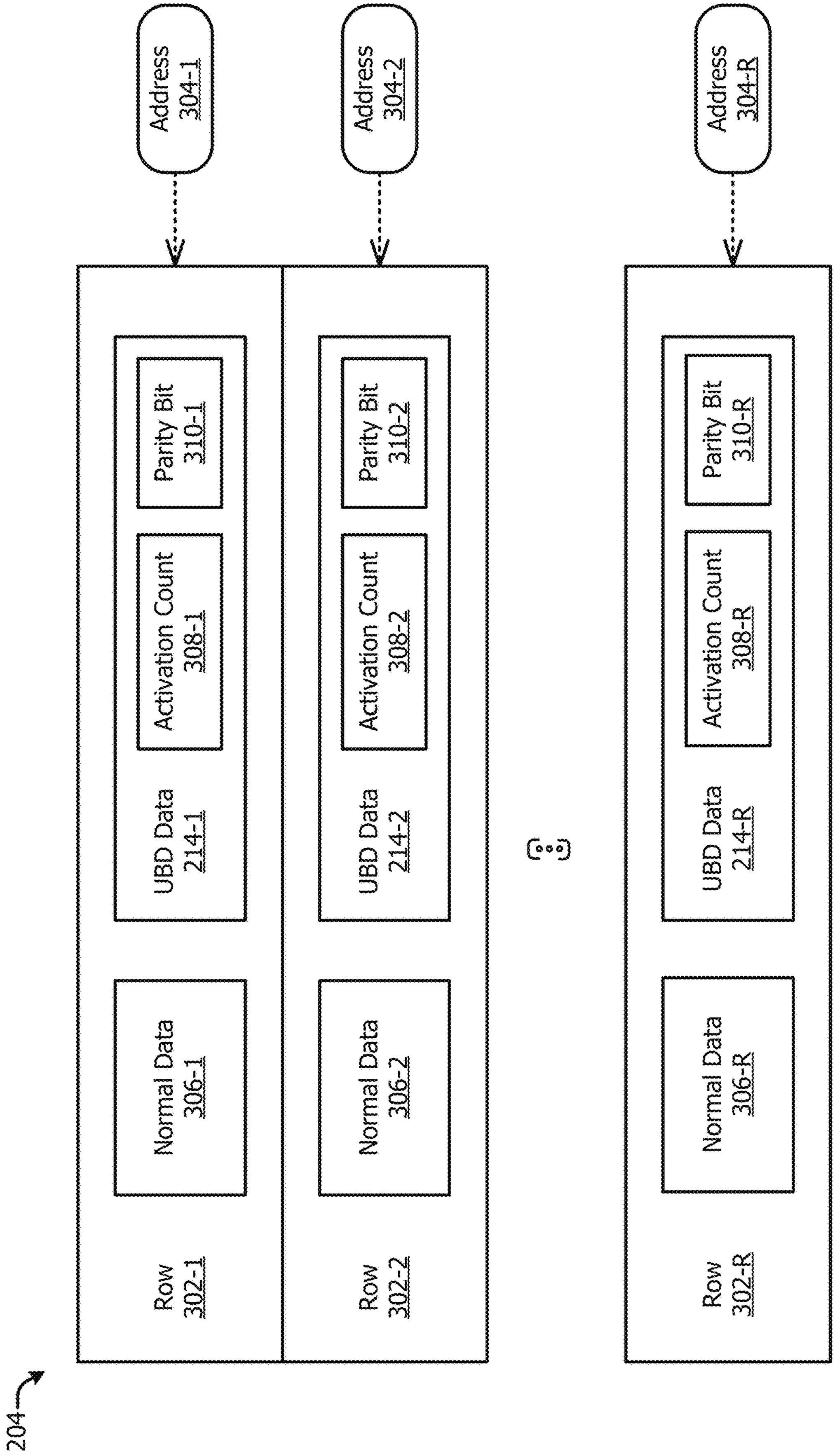
FIG. 3 illustrates example data stored within rows of a memory array.

FIG. 3 illustrates example data stored within rows of the memory array 204. The memory array 204 includes multiple rows 302 of memory cells. For example, the memory array 204 depicted in FIG. 3 includes rows 302-1, 302-2 . . . 302-R, where R represents a positive integer. Each row 302 is associated with an address 304 (e.g., a row address, a memory row address, or a memory address). For example, the first row 302-1 has a first address 304-1, the second row 302-2 has a second address 304-2, and an $R^{th}$ row 302-R has an $R^{th}$ address 304-R.

Each of the rows 302 can store normal data 306 within a first subset of the memory cells associated with that row 302. The normal data 306 represents data that is read from or written to the memory device 108 during normal memory operations (e.g., during normal read or write operations). The normal data 306, for example, can include data that is transmitted by the memory controller 114 and is written to one or more rows 302 of the memory array 204.

In addition to the normal data 306, each of the rows 302 can store usage-based-disturbance data 214 within a second subset of the memory cells associated with that row 302. The usage-based-disturbance data 214 includes information that enables the usage-based-disturbance circuit 118 to mitigate usage-based disturbance. In an example implementation, the usage-based-disturbance data 214 includes an activation count 308. With the activation count 308, the memory device 108 can keep track of a quantity of accesses or activations of the corresponding memory row 302. In some example implementations, the usage-based-disturbance data 214 can also include a count of how many times a neighboring row (e.g., an adjacent or a proximate row) is refreshed in order to mitigate usage-based disturbance. Each of these counts provide an example means by which the memory device 108 can monitor for usage-based disturbance and determine when to refresh victim rows to reduce the risk of usage-based disturbance corrupting data.

In the example shown in FIG. 3, the first row 302-1 stores first normal data 306-1 within a first subset of memory cells of the first row 302-1 and stores first usage-based-disturbance data 214-1 within a second subset of memory cells of the first row 302-1. The first usage-based-disturbance data 214-1 includes a first activation count 308-1, which represents a quantity of times the first row 302-1 has been activated since a last refresh. As another example, the second row 302-2 stores second normal data 306-2 within a first subset of memory cells within the second row 302-2 and stores second usage-based-disturbance data 214-2 within a second subset of memory cells within the second row 302-2. The second usage-based-disturbance data 214-2 includes a second activation count 308-2, which represents a quantity of times the second row 302-2 has been activated since a last refresh. Additionally, the $R^{th}$ row 302-R stores $R^{th}$ normal data 306-R within a first subset of memory cells within the $R^{th}$ row 302-R and stores $R^{th}$ usage-based-disturbance data 214-R within a second subset of memory cells within the $R^{th}$ row 302-R. The $R^{th}$ usage-based-disturbance data 214-R includes an $R^{th}$ activation count 308-R, which represents a quantity of times the $R^{th}$ row 302-R has been activated since a last refresh.

The usage-based-disturbance data 214 can also include information or can be formatted (e.g., coded) in such a way as to support error detection. In this example, the usage-based-disturbance data 214 includes a parity bit 310. In particular, the usage-based-disturbance data 214-1, 214-2, and 214-R respectively include parity bits 310-1, 310-2, and 310-R. Other implementations are also possible in which the usage-based-disturbance data 214 is coded in a manner that supports any of the error detection tests described above, such as the error-correcting-code check. Although the techniques for detecting a condition associated with usage-based disturbance is generally described with respect to the activation count 308, these techniques can generally be applied to detecting a condition based on any type of information that is represented by the usage-based-disturbance data 214, including error detection techniques. The usage-based-disturbance data 214 associated with different rows 302 can be accessed using different combinations of column select lines, as further described with respect to FIG. 4.

Figure 4:
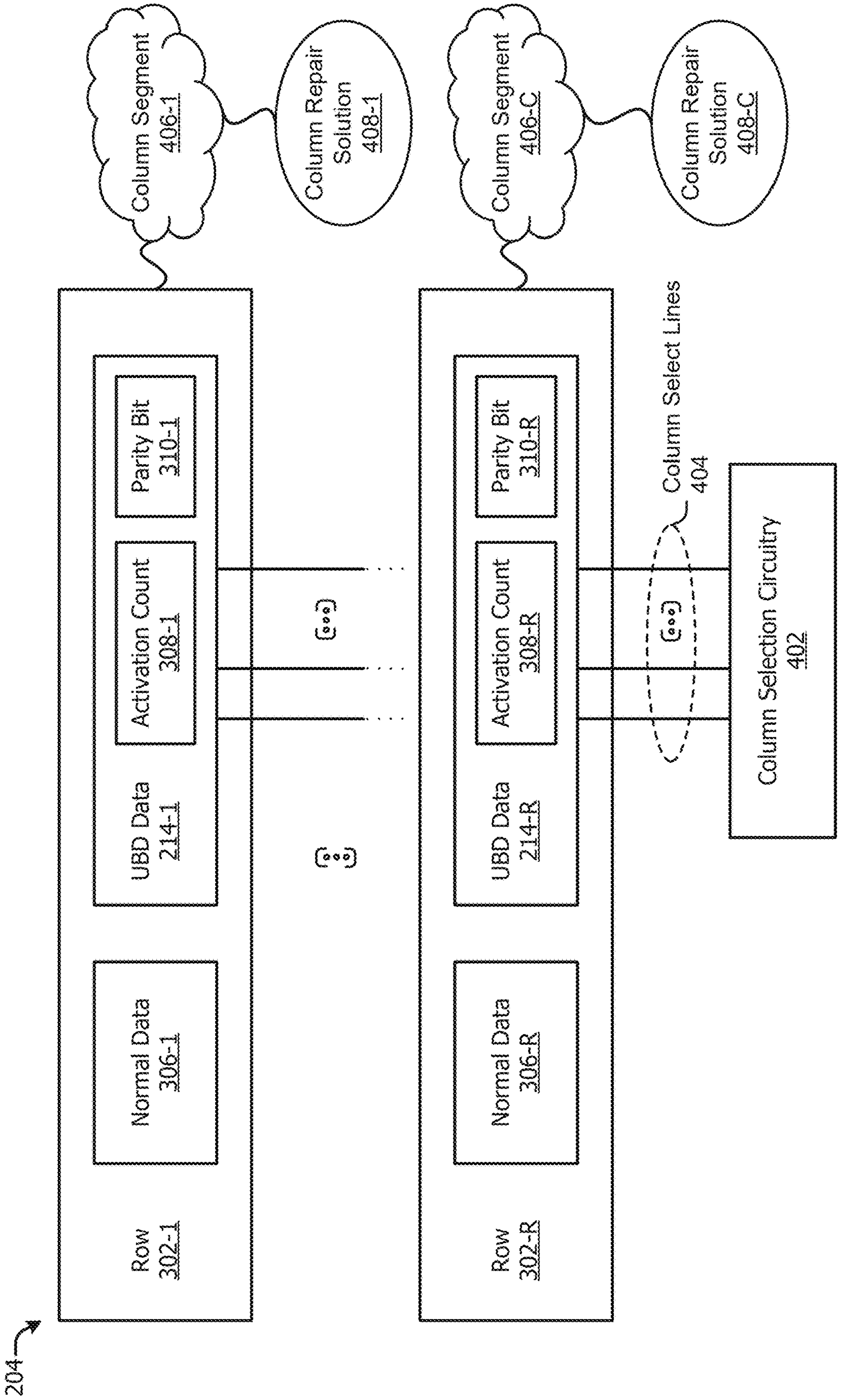
FIG. 4 illustrates example column select lines for reading usage-based-disturbance data within rows of a memory array.

FIG. 4 illustrates two rows 302-1 and 302-R of the memory array 204, which are coupled to column selection circuitry 402 via column select lines 404. The column selection circuitry 402 can be implemented as part of the control circuitry 120 and can include multiple drivers, which are respectively coupled to the column select lines 404. The column select lines 404 shown in FIG. 4 can be used to activate or deactivate bit lines corresponding to memory cells that store the usage-based-disturbance data 214. When the appropriate bit lines are active, the memory device 108 can read from or write to the usage-based-disturbance data 214. Although not explicitly shown in FIG. 4, the memory device 108 can include other column selection circuitry 402 and other column select lines 404 that enable the normal data 306 to be accessed.

In some implementations, the memory array 204 has one or more spare columns capable of storing portions of the usage-based-disturbance data 214. Consider an example in which each row 302 includes three columns for storing the activation count 308 and an additional spare column, which can be used to replace a defective column. In this case, there are four total columns, three of which may be used to actively store the activation count 308 at a given time.

The rows 302 of the memory array 204 are assigned to a particular column segment 406. For example, the row 302-1 is associated with a column segment 406-1, and the row 302-R is associated with column segment 406-C. Each column segment 406 is associated with a particular column repair solution 408, which may be similar or different from a column repair solution 408 of another column segment 406. For example, the column segment 406-1 is associated with a column repair solution 408-1, and the column segment 406-C is associated with column repair solution 406-C. Rows 302 within a same column segment 406 share the same column repair solution 408. The column repair solutions 408 indicate which column select lines 404 are to be activated to access the stored data. As the rows 302-1 and 302-R are associated with different column segments 406-1 and 406-C, different column repair solutions 408-1 and 408-C can be used to access the activation counts 308-1 and 308-R.

Consider an example in which a first set of bit lines are associated with memory cells that store the activation count 308-1 within the row 302-1. Also, a second set of bit lines are associated with memory cells that store the activation count 308-R within the row 302-R. To access the activation count 308-1, the column selection circuitry 402 appropriately activates a first set of the column select lines 404 based on the column repair solution 408-1 to cause the first set of bit lines to be activated. To access the activation count 308-R, the column selection circuitry 402 appropriately activates a second set of the column select lines 404 based on the column repair solution 408-C to cause the second set of bit lines to be activated.

EXAMPLE TECHNIQUES AND HARDWARE

Figure 5:
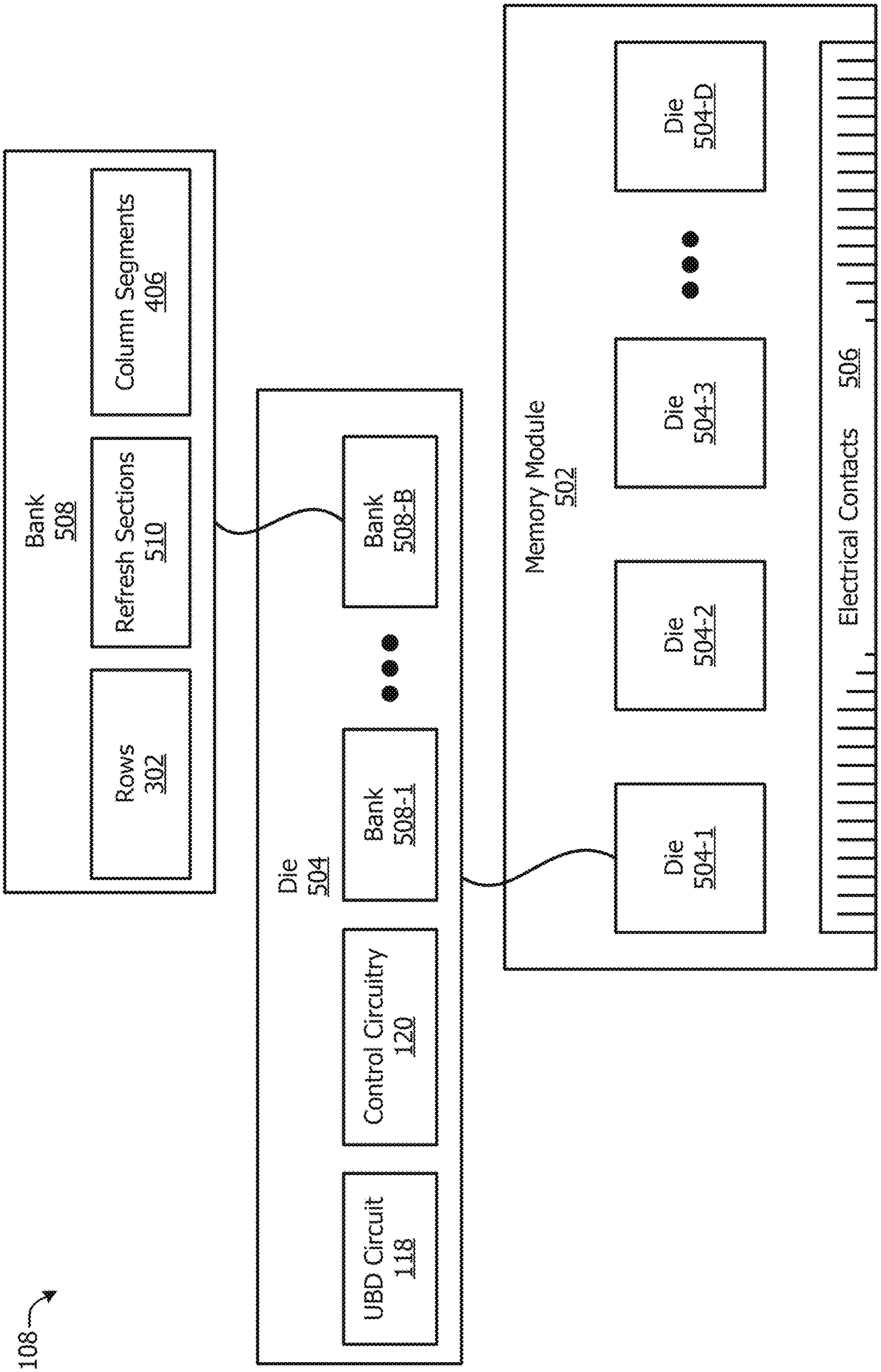
FIG. 5 illustrates an example memory device capable of performing serialized update procedures during a refresh period may be implemented.

FIG. 5 illustrates an example memory device 108 in which aspects of performing serialized update procedures during a refresh period can be implemented. The memory device 108 includes a memory module 502, which can include multiple dies 504. As illustrated, the memory module 502 includes a first die 504-1, a second die 504-2, a third die 504-3, and a $D^{th}$ die 504-D, with D representing a positive integer. The memory module 502 can be a SIMM or a DIMM. As another example, the memory module 502 can interface with other components via a bus interconnect (e.g., a Peripheral Component Interconnect Express (PCIe®) bus). The memory device 108 illustrated in FIGS. 1 and 2 can correspond, for example, to multiple dies (or dice) 504-1 through 504-D, or a memory module 502 with two or more dies 504. As shown, the memory module 502 can include one or more electrical contacts 506 (e.g., pins) to interface the memory module 502 to other components.

The memory module 502 can be implemented in various manners. For example, the memory module 502 may include a printed circuit board, and the multiple dies 504-1 through 504-D may be mounted or otherwise attached to the printed circuit board. The dies 504 (e.g., memory dies) may be arranged in a line or along two or more dimensions (e.g., forming a grid or array). The dies 504 may have a similar size or may have different sizes. Each die 504 may be similar to another die 504 or different in size, shape, data capacity, or control circuitries. The dies 504 may also be positioned on a single side or on multiple sides of the memory module 502.

One or more of the dies 504-1 to 504-D include the usage-based-disturbance circuit 118, the control circuitry 120, and multiple banks 508-1 to 508-B, where B represents a positive integer. The banks 508-1 to 508-B can be associated with one or more bank groups. In some implementations, the die 504 includes multiple instances of the usage-based-disturbance circuit 118, which mitigate usage-based disturbance across at least one of the banks 508. For example, multiple instances of the usage-based-disturbance circuit 118 can respectively mitigate usage-based disturbance across the bank groups.

In other implementations, multiple instances of the usage-based-disturbance circuit 118 can respectively mitigate usage-based disturbance for respective banks 508. In this case, each usage-based-disturbance circuit 118 mitigates usage-based disturbance for a single bank 508 within one of the bank groups. In yet other example implementations, each usage-based-disturbance circuit 118 mitigates usage-based disturbance for a subset of the banks 508 associated with one of the bank groups, where the subset of the banks 508 includes at least two banks 508.

Each bank 508 includes multiple rows 302. The rows 302 are grouped into different refresh sections 510 and different column segments 406. Each row 302 is associated with a single refresh section 510 and a single column segment 406. The refresh circuitry 208 can concurrently refresh one row 302 within each refresh section 510, which improves an efficiency of the refresh operation. Explained another way, the memory device 108 can refresh multiple rows 302 simultaneously if the multiple rows 302 are associated with different refresh sections 510. In some examples, each refresh section 510 can be divided into different column segments 406, as further described with respect to FIG. 6.

Figure 6:
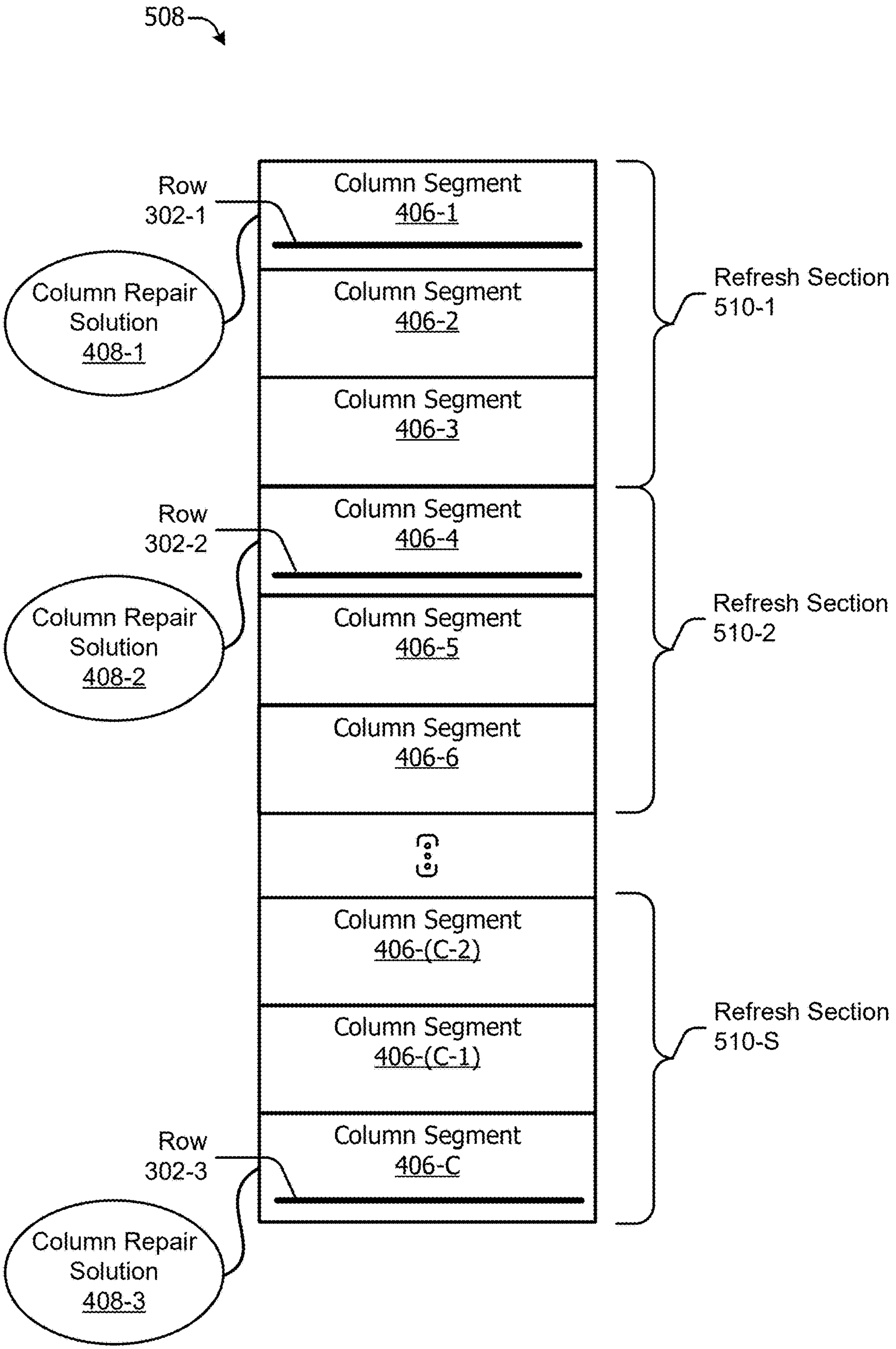
FIG. 6 illustrates an example bank having multiple column segments per refresh section.

FIG. 6 illustrates an example bank 508 having multiple column segments 406 per refresh section 510. In the depicted configuration, the bank 508 is shown as having refresh sections 510-1, 510-2 . . . 510-S, where S represents a positive integer. In this example, each refresh section 510 includes three column segments 406. For example, refresh section 510-1 includes column segments 406-1, 406-2, and 406-3. Refresh section 510-2 includes column segments 406-4, 406-5, and 406-6. Refresh section 510-S includes column segments 406-(C-2), 406-(C-1), and 406-C. Other examples are also possible in which each refresh section 510 includes a different quantity of column segments 406, such as two column segments, four column segments, and so forth.

During a refresh operation, the memory device 108 can refresh multiple rows in different refresh sections 510 during a same time interval (e.g., concurrently or simultaneously). For example, the memory device 108 can concurrently refresh row 302-1 in refresh section 510-1, row 302-2 in refresh section 510-2, and row 302-3 in refresh section 510-S. The rows 302 that are refreshed are also associated with different column segments 406. For example, row 310-1 is associated with column segment 406-1, row 302-2 is associated with column segment 406-4, and row 302-3 is associated with column segment 406-C.

Due to the different column segments 406, the memory device 108 needs to reference different column repair solutions 408 to update the usage-based-disturbance data 214 corresponding to the rows 302-1, 302-2, and 302-3. In this case, the column repair solutions 408-1, 408-2, and 408-3 are used to update the usage-based-disturbance data 214 within the rows 302-1, 302-2, and 302-3, respectively. The update procedures for each refreshed row 302 is performed in a serialized manner, as further described with respect to FIG. 7.

Figure 7:
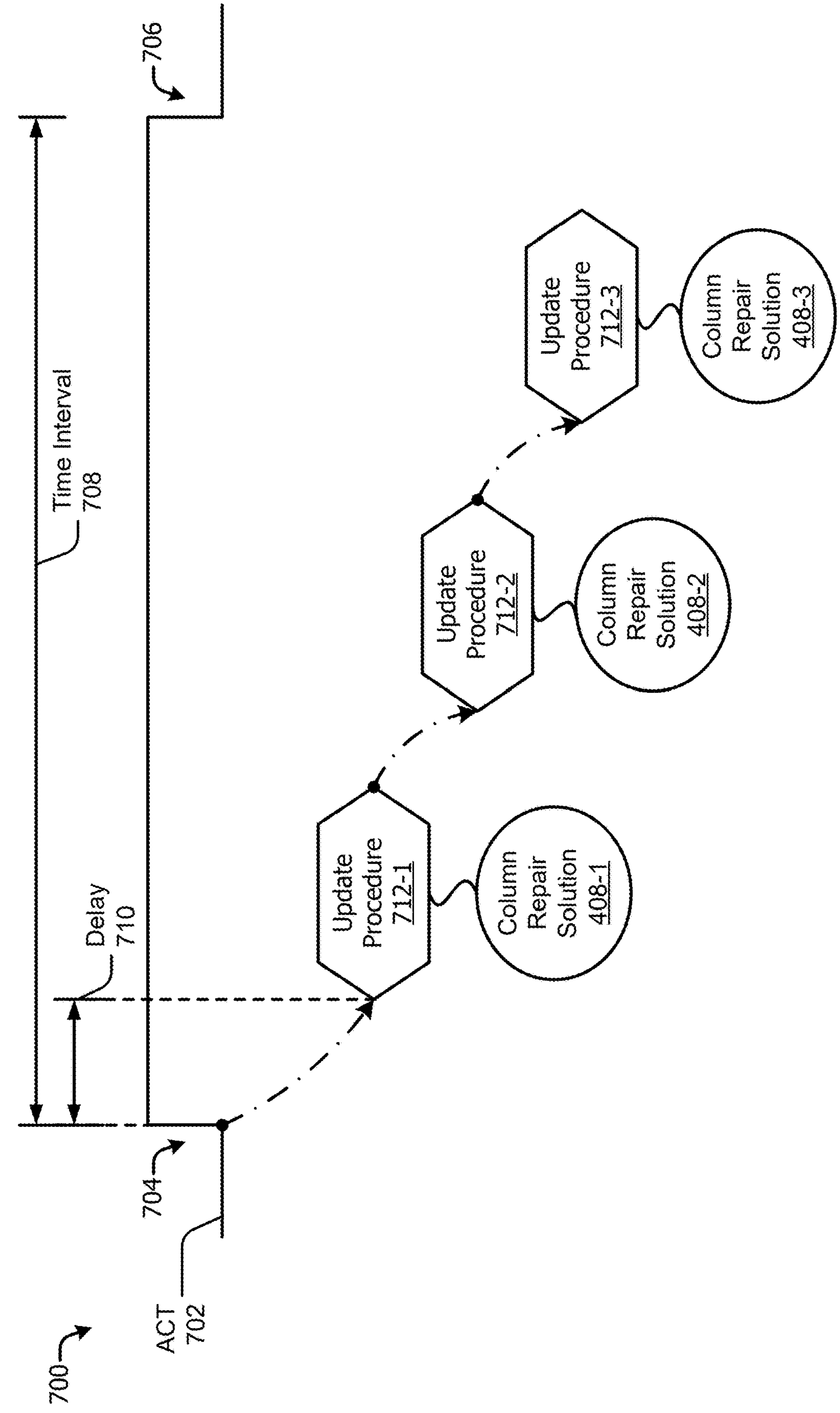
FIG. 7 illustrates an example timing diagram of a memory device performing serialized update procedures during a refresh period.

FIG. 7 illustrates an example timing diagram 700 of a memory device 108 performing serialized update procedures during a refresh period. Prior to time 704, the memory device 108 receives a refresh command from the memory controller 114. The refresh command can be associated with a self-refresh operation or an auto-refresh operation. Based on the refresh command, the control circuitry 120 generates a bank activate signal 702. At 704, the control circuitry 120 triggers the bank activate signal 702 to go high to indicate a start of a refresh pump. At 706, the control circuitry 120 triggers the bank activate signal 702 to go low to indicate an end of the refresh pump. In this example, the refresh pump has a duration identified by a time interval 708.

At 704, multiple rows 302 of the bank 508 are refreshed concurrently. These rows 302 are associated with different refresh sections 510. After a delay 710 has elapsed since a start of the refresh pump at 704, the control circuitry 120 causes the usage-based-disturbance circuit 118 to perform multiple update procedures 712 in a serialized manner on the refreshed rows 302. In some cases, the delay 710 represents or is associated with a row-to-column delay (tRCD). As seen in FIG. 7, the usage-based-disturbance circuit 118 performs a first update procedure 712-1 during a first portion of the time interval 708, a second update procedure 712-2 during a second portion of the time interval 708, and a third update procedure 712-3 during a third portion of the time interval 708. The update procedures 712-1, 712-2, and 712-3 can be used to update the usage-based-disturbance data 214 stored within the rows 302-1, 302-2, and 302-3 of FIG. 6, respectively. A time between starting a refresh operation at 704 and performing a next refresh operation or activating another row is represented by a refresh cycle time (tRFC). This time is sufficiently long to enable multiple update procedures 712 to be performed in a serialized manner. Although three update procedures 712 are explicitly shown in FIG. 7, the memory device 108 can perform as many update procedures 712 that can fit within this timing window.

To perform the update procedures 712-1, 712-2, and 712-3, the memory device 108 uses column repair solutions 408-1, 408-2, and 408-3, respectively, to access the usage-based-disturbance data 214 of the refreshed rows 302-1, 302-2, and 302-3. As shown in FIG. 7, the update procedures 712-1, 712-2, and 712-3 are performed in series (e.g., performed in a serialized manner) so that the appropriate column repair solution 408 can be utilized for each update procedure 712.

The usage-based-disturbance circuit 118 performs the update procedure 712 by updating (e.g., changing) a value of the usage-based-disturbance data 214 within a specified row 302. The updating of the value can involve setting the value of the usage-based-disturbance data 214 to a fixed default value, a randomized value, or a value that is calculated based on a current value of the usage-based-disturbance data 214. Consider an example in which the update procedure 712 updates the activation count 308. In this example, the usage-based-disturbance circuit 118 can write a default value (e.g., zero or some other integer) to the activation count 308 or write a random value to the activation count 308. As another example, the usage-based-disturbance circuit 118 can read a current value of the activation count 308, subtract a predetermined number from the current value, and write a result of the subtraction to the activation count 308. By performing the update procedures 712-1 to 712-3 in a serialized manner, the memory device 108 also avoids conflicts on the global input/output lines which would otherwise arise if the memory device 108 attempted to read and/or write values to the usage-based-disturbance data 214 of multiple refreshed rows at a same time.

EXAMPLE METHOD

Figure 8:
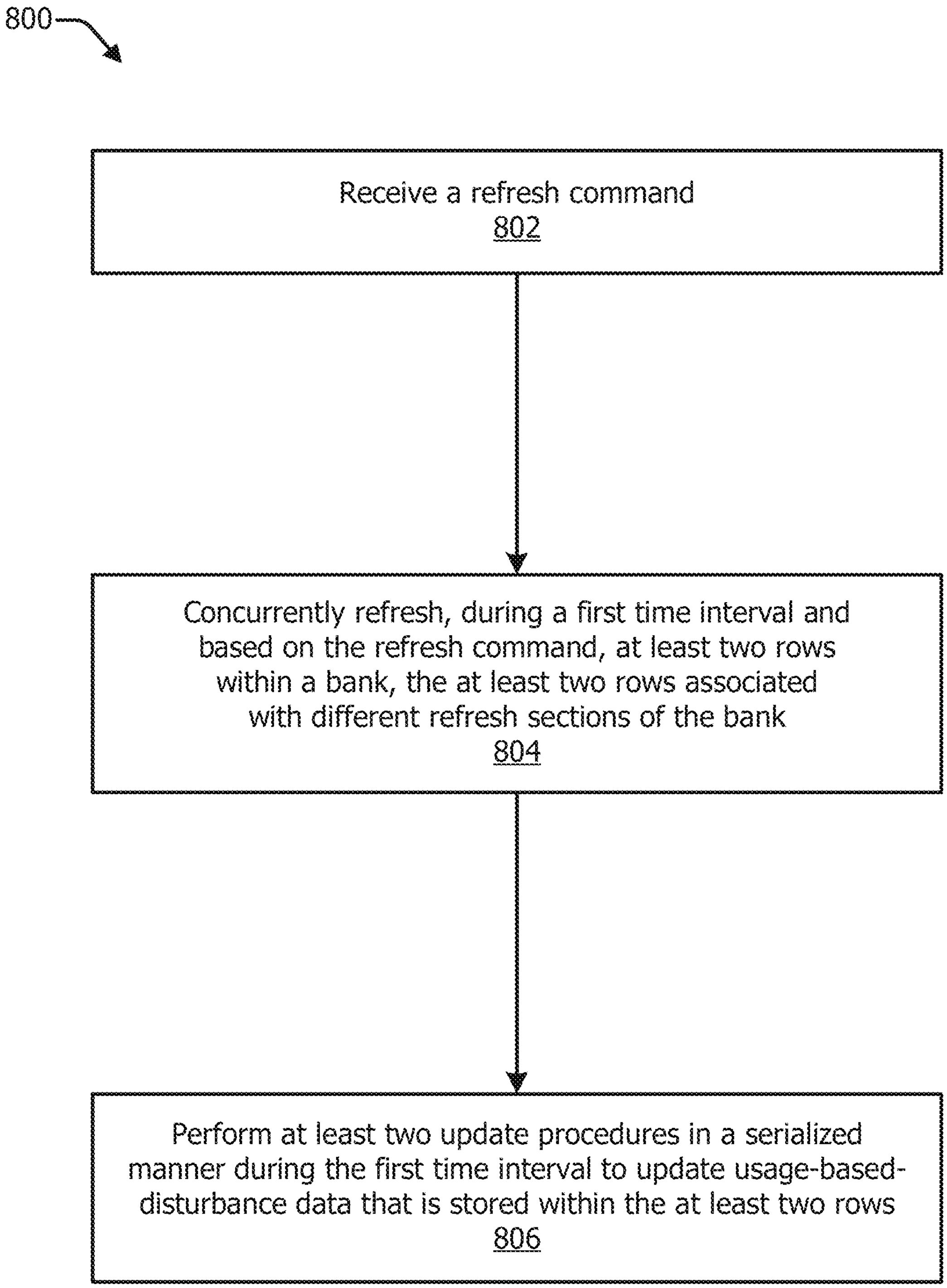
FIG. 8 illustrates an example method for performing serialized update procedures during a refresh period.

This section describes example methods for performing serialized update procedures during a refresh period with reference to the flow diagram of FIG. 8. These descriptions may also refer to components, entities, and other aspects depicted in FIGS. 1 to 7 by way of example only. The described methods are not necessarily limited to performance by one entity or multiple entities operating on one device.

FIG. 8 illustrates a flow diagram 800, which includes operations 802 to 806. In aspects, operations of the method of the flow diagram 800 are implemented by or with the usage-based-disturbance circuit 118 and the control circuitry 120 as described with reference to FIGS. 1 to 3. At 802, a refresh command is received. For example, the control circuitry 120 receives the refresh command from the memory controller 114. The refresh command can cause the memory device 108 to perform a self-refresh operation or an auto-refresh operation.

At 804, at least two rows within a bank are concurrently refreshed during a first time interval and based on the refresh command. For example, the memory device 108 refreshes rows 302-1 and 302-2 of the bank 508, as shown in FIG. 6, during a first time interval and based on the refresh command.

At 806, at least two update procedures are performed in a serialized manner during the first time interval to update usage-based-disturbance data that is stored within the at least two rows. For example, the usage-based-disturbance circuit 118 performs at least two update procedures 712 in a serialized manner during the first time interval to update the usage-based-disturbance data 214 that is stored within the at least two rows 302, as shown in FIG. 7. The usage-based-disturbance circuit 118 can update the usage-based-disturbance data 214 by setting the usage-based-disturbance data 214 to a fixed default value, a randomized value, or a value that is calculated based on a read value of the usage-based-disturbance data 214. Example usage-based-disturbance data 214 can include the activation count 308, as shown in FIG. 3. To update the activation count 308, the usage-based-disturbance data 214 can set the activation count 308 to a fixed default value, a random number, or a value that is smaller than a current value of the activation count 308.

For the figures described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1-3, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

In the following, various examples for implementing aspects of serialized update procedures during a refresh period are described:

Example 1: A method performed by a memory device, the method comprising:
- receiving a refresh command;
- concurrently refreshing, during a time interval and based on the refresh command, at least two rows within a bank of the memory device, the at least two rows associated with different refresh sections of the bank; and
- performing at least two update procedures in a serialized manner during the time interval to update usage-based-disturbance data stored within the at least two rows.

Example 2: The method of example 1, wherein the usage-based-disturbance data comprises activation counts associated with the at least two rows.

Example 3: The method of example 2, wherein the performing of the at least two update procedures comprises setting the activations counts stored within the at least two rows to at least one default value.

Example 4: The method of example 3, wherein the at least one default value comprises:
- a same fixed value;
- different randomized values; or
- values calculated based on current values of the activation counts.

Example 5: The method of any previous example, wherein:
- the at least two rows are associated with different column segments; and
- the different column segments are associated with different column repair solutions.

Example 6: The method of example 5, wherein the performing of the at least two update procedures comprises updating the usage-based disturbance data stored within the at least two rows by activating different sets of column select lines associated with the different column repair solutions.

Example 7: The method of any previous example, wherein:
- the at least two rows comprise a first row and a second row;
- the performing of the at least two update procedures comprises:
- performing a first update procedure on the first row during a first portion of the time interval; and
- performing a second update procedure on the second row during a second portion of the time interval, the second portion occurring after the first portion.

Example 8: The method of example 7, wherein:
- the at least two rows comprise a third row;
- the different refresh sections comprise a first refresh section, a second section, and a third refresh section;
- the first, second, and third rows are respectively associated with the first, second and third refresh sections;
- the refreshing comprises concurrently refreshing, during the time interval and based on the refresh command, the first, second, and third rows; and
- the performing of the at least two update procedures further comprises:
  - performing a third update procedure on the third row during a third portion of the time interval, the third portion occurring after the second portion.

Example 9: The method of example 8, wherein the performing of the at least two update procedures comprises performing the first, second, and third update procedures during the refreshing of the first, second, and third rows and prior to an end of a refresh cycle time (tRFC) corresponding to the refresh command.

Example 10: An apparatus comprising:
- a memory device configured to receive a refresh command, the memory device comprising:
  - at least one bank comprising multiple rows associated with different refresh sections of the at least one bank, each row of the multiple rows configured to store usage-based-disturbance data corresponding to the row;
  - circuitry coupled to the at least one bank, the circuitry configured to concurrently refresh, during a time interval and based on the refresh command, at least two rows of the multiple rows; and
- a circuit coupled to the at least one bank and configured to perform at least two update procedures in a serialized manner during the time interval to update the usage-based-disturbance data stored within the at least two rows.

Example 11: The apparatus of example 10, wherein the usage-based-disturbance data comprises activation counts associated with the at least two rows.

Example 12: The apparatus of example 10 or 11, wherein:
- the at least two rows are associated with different column segments; and
- the different column segments are associated with different column repair solutions.

Example 13: The apparatus of any one of examples 10-12, wherein:
- the at least two rows comprise:
  - a first row associated with a first column segment of the different column segments; and
  - a second row associated with a second column segment of the different column segments;
- the at least two update procedures comprise a first update procedure and a second update procedure;

the different column repair solutions comprise a first column repair solution and a second column repair solution; and the memory device is configured to:

activate a first set of column select lines based on the first column repair solution to enable the circuit to perform the first update procedure on the usage-based-disturbance data stored within the first row; and activate a second set of the column select lines based on the second column repair solution to enable the circuit to perform the second update procedure on the usage-based-disturbance data stored within the second row.

Example 14: The apparatus of example 13, wherein:

the at least two rows further comprise a third row associated with a third column segment of the different column segments;

the at least two update procedures further comprise a third update procedure;

the different column repair solutions further comprise a third column repair solution; and the memory device is configured to:

activate a third set of the column select lines based on the third column repair solution to enable the circuit to perform the third update procedure on the usage-based-disturbance data stored within the third row.

Example 15: The apparatus of example 14, wherein the circuit is configured to perform the first, second, and third update procedures during the refreshing of the first, second, and third rows and prior to an end of a refresh cycle time (tRFC) corresponding to the refresh command.

Example 16: The apparatus of example 15, wherein the circuit is configured to perform the first update procedure after a time interval associated with a row column delay has elapsed since reception of the refresh command.

Example 17: A method performed by a memory device, the method comprising:

performing, during a first portion of a time interval and based on a refresh command, a first update procedure that updates usage-based-disturbance data that is stored within a first refreshed row, the first refreshed row associated with a first refresh section and a first column segment; and performing, during a second portion of the time interval and based on the refresh command, a second update procedure that updates usage-based-disturbance data that is stored within a second refreshed row, the second refreshed row associated with a second refresh section and a second column segment.

Example 18: The method of example 17, wherein the performing of the first and second update procedures comprises performing the first and second update procedures during the refreshing of the first and second rows and prior to an end of a refresh cycle time (tRFC) corresponding to the refresh command.

Example 19: The method of example 17 or 18, wherein:

the performing of the first update procedure comprises updating an activation count associated with the first refreshed row; and the performing of the second update procedure comprises updating an activation count associated with the second refreshed row.

Example 20: The method of any one of examples 17 to 19, wherein:

the performing of the first update procedure comprises activating a first set of column select lines based on a first column repair solution associated with the first column segment; and the performing of the second update procedure comprises activating a second set of the column select lines based on a second column repair solution associated with the second column segment.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although aspects of performing serialized update procedures during a refresh period have been described in language specific to certain features and/or methods, the subject of the appended claims is not necessarily limited to the specific features or methods described. Rather, the specific features and methods are disclosed as a variety of example implementations of performing serialized update procedures during a refresh period.

What is claimed is:

1. A method performed by a memory device, the method comprising:

receiving a refresh command;

concurrently refreshing, during a time interval and based on the refresh command, at least two rows within a bank of the memory device, the at least two rows associated with different refresh sections of the bank; and performing at least two update procedures in a serialized manner during the time interval to update usage-based-disturbance data stored within the at least two rows.

2. The method of claim 1, wherein the usage-based-disturbance data comprises activation counts associated with the at least two rows.

3. The method of claim 2, wherein the performing of the at least two update procedures comprises setting the activations counts stored within the at least two rows to at least one default value.

4. The method of claim 3, wherein the at least one default value comprises:

a same fixed value;

different randomized values; or values calculated based on current values of the activation counts.

5. The method of claim 1, wherein:

the at least two rows are associated with different column segments; and the different column segments are associated with different column repair solutions.

6. The method of claim 5, wherein the performing of the at least two update procedures comprises updating the usage-based disturbance data stored within the at least two rows by activating different sets of column select lines associated with the different column repair solutions.

7. The method of claim 1, wherein:
the at least two rows comprise a first row and a second row;
the performing of the at least two update procedures comprises:
performing a first update procedure on the first row during a first portion of the time interval; and
performing a second update procedure on the second row during a second portion of the time interval, the second portion occurring after the first portion.

8. The method of claim 7, wherein:
the at least two rows comprise a third row;
the different refresh sections comprise a first refresh section, a second section, and a third refresh section;
the first, second, and third rows are respectively associated with the first, second and third refresh sections;
the refreshing comprises concurrently refreshing, during the time interval and based on the refresh command, the first, second, and third rows; and
the performing of the at least two update procedures further comprises:
performing a third update procedure on the third row during a third portion of the time interval, the third portion occurring after the second portion.

9. The method of claim 8, wherein the performing of the at least two update procedures comprises performing the first, second, and third update procedures during the refreshing of the first, second, and third rows and prior to an end of a refresh cycle time (tRFC) corresponding to the refresh command.

10. An apparatus comprising:
a memory device configured to receive a refresh command, the memory device comprising:
at least one bank comprising multiple rows associated with different refresh sections of the at least one bank, each row of the multiple rows configured to store usage-based-disturbance data corresponding to the row;
circuitry coupled to the at least one bank, the circuitry configured to concurrently refresh, during a time interval and based on the refresh command, at least two rows of the multiple rows; and
a circuit coupled to the at least one bank and configured to perform at least two update procedures in a serialized manner during the time interval to update the usage-based-disturbance data stored within the at least two rows.

11. The apparatus of claim 10, wherein the usage-based-disturbance data comprises activation counts associated with the at least two rows.

12. The apparatus of claim 10, wherein:
the at least two rows are associated with different column segments; and
the different column segments are associated with different column repair solutions.

13. The apparatus of claim 12, wherein:
the at least two rows comprise:
a first row associated with a first column segment of the different column segments; and
a second row associated with a second column segment of the different column segments;
the at least two update procedures comprise a first update procedure and a second update procedure;
the different column repair solutions comprise a first column repair solution and a second column repair solution; and
the memory device is configured to:
activate a first set of column select lines based on the first column repair solution to enable the circuit to perform the first update procedure on the usage-based-disturbance data stored within the first row; and
activate a second set of the column select lines based on the second column repair solution to enable the circuit to perform the second update procedure on the usage-based-disturbance data stored within the second row.

14. The apparatus of claim 13, wherein:
the at least two rows further comprise a third row associated with a third column segment of the different column segments;
the at least two update procedures further comprise a third update procedure;
the different column repair solutions further comprise a third column repair solution; and
the memory device is configured to:
activate a third set of the column select lines based on the third column repair solution to enable the circuit to perform the third update procedure on the usage-based-disturbance data stored within the third row.

15. The apparatus of claim 14, wherein the circuit is configured to perform the first, second, and third update procedures during the refreshing of the first, second, and third rows and prior to an end of a refresh cycle time (tRFC) corresponding to the refresh command.

16. The apparatus of claim 15, wherein the circuit is configured to perform the first update procedure after a time interval associated with a row column delay has elapsed since reception of the refresh command.

17. A method performed by a memory device, the method comprising:
performing, during a first portion of a time interval and based on a refresh command, a first update procedure that updates usage-based-disturbance data that is stored within a first refreshed row, the first refreshed row associated with a first refresh section and a first column segment; and
performing, during a second portion of the time interval and based on the refresh command, a second update procedure that updates usage-based-disturbance data that is stored within a second refreshed row, the second refreshed row associated with a second refresh section and a second column segment.

18. The method of claim 17, wherein the performing of the first and second update procedures comprises performing the first and second update procedures during the refreshing of the first and second rows and prior to an end of a refresh cycle time (tRFC) corresponding to the refresh command.

19. The method of claim 17, wherein:
the performing of the first update procedure comprises updating an activation count associated with the first refreshed row; and
the performing of the second update procedure comprises updating an activation count associated with the second refreshed row.

20. The method of claim 17, wherein:

the performing of the first update procedure comprises activating a first set of column select lines based on a first column repair solution associated with the first column segment; and the performing of the second update procedure comprises activating a second set of the column select lines based on a second column repair solution associated with the second column segment.

* * * * *